United States Patent
Fiolka

(10) Patent No.: US 8,625,071 B2
(45) Date of Patent: Jan. 7, 2014

(54) OPTICAL SYSTEM AND METHOD FOR CHARACTERISING AN OPTICAL SYSTEM

(75) Inventor: Damian Fiolka, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 638 days.

(21) Appl. No.: 12/778,649

(22) Filed: May 12, 2010

(65) Prior Publication Data

US 2010/0220303 A1  Sep. 2, 2010

Related U.S. Application Data

(63) Continuation of application No. PCT/EP2008/065502, filed on Nov. 13, 2008.

(60) Provisional application No. 60/988,464, filed on Nov. 16, 2007.

(30) Foreign Application Priority Data

Nov. 16, 2007 (DE) .......................... 10 2007 055 062

(51) Int. Cl.
G03B 27/32 (2006.01)
(52) U.S. Cl.
USPC .................... 355/53; 355/63; 355/67; 355/77
(58) Field of Classification Search
USPC .................................. 355/53, 63, 67; 356/445
See application file for complete search history.

(56) References Cited

U.S. PATENT DOCUMENTS

| | | | |
|---|---|---|---|
| 6,373,614 B1 | 4/2002 | Miller | |
| 2004/0223228 A1 | 11/2004 | Kishikawa et al. | |
| 2005/0179881 A1* | 8/2005 | Kohno | 355/53 |
| 2006/0033019 A1 | 2/2006 | Takeuchi et al. | |
| 2007/0146676 A1 | 6/2007 | Tanitsu et al. | |

OTHER PUBLICATIONS

International Preliminary Report on Patentability for PCT Application No. PCT/EP2008/065502 dated May 27, 2010.

* cited by examiner

*Primary Examiner* — Steven H Whitesell Gordon
*Assistant Examiner* — Mesfin T Asfaw
(74) *Attorney, Agent, or Firm* — Fish & Richardson P.C.

(57) ABSTRACT

The disclosure provides an optical system and a method of characterising an optical system, such as in a microlithographic projection exposure apparatus. According to an aspect, an optical system having an optical axis (OA) includes a first element which is partially translucent for light of a working wavelength of the optical system. The first element has at least one partially reflecting first surface arranged rotated about a first axis of rotation in relation to a plane perpendicular to the optical axis (OA). The optical system also includes a second element in succession to the first element along the optical axis (OA). The second element is partially translucent for light of the working wavelength and has at least one partially reflecting second surface which is arranged rotated about a second axis of rotation in relation to a plane perpendicular to the optical axis (OA). The system further includes an intensity measuring device configured to measure the intensity of light reflected at the first surface and the intensity of light reflected at the second surface.

37 Claims, 8 Drawing Sheets

OPTICAL SYSTEM AND METHOD FOR CHARACTERISING AN OPTICAL SYSTEM

CROSS-REFERENCE TO RELATED APPLICATIONS

This application is a continuation of, and claims benefit under 35 USC 120 to, international application PCT/EP2008/065502, filed Nov. 13, 2008, which claims benefit of German Application No. 10 2007 055 062.8, filed Nov. 16, 2007 and U.S. Ser. No. 60/988,464, filed Nov. 16, 2007. International application PCT/EP2008/065502 is hereby incorporated by reference in its entirety.

FIELD

The disclosure relates to an optical system and a method of characterising an optical system, such as in a microlithographic projection exposure apparatus.

BACKGROUND

Microlithography is used for the production of microstructured components such as for example integrated circuits or LCDs. The microlithography process is carried out in what is referred to as a projection exposure apparatus having an illumination system and a projection objective. The image of a mask (=reticle) illuminated via the illumination system is in that projected via the projection objective onto a substrate (for example a silicon wafer) which is coated with a light-sensitive layer (photoresist) and arranged in the image plane of the projection objective to transfer the mask structure onto the light-sensitive coating on the substrate.

To ensure that the light-sensitive resist on the substrate is exposed with the desired amount of light or intensity during the scanning process, it is known, for example in an illumination system, for light to be firstly coupled out at a suitable position in the beam path and for measurement of the intensity distribution then to be performed on that coupled-out light component.

That is diagrammatically illustrated in FIG. 8 which is a diagrammatic view of a structure in principle of a microlithographic projection exposure apparatus 1 having an illumination system 10 and a projection objective 20. The illumination system 10 is used to illuminate a structure-bearing mask (reticle) 30 with light from a light source unit 5 which for example includes an ArF-laser for a working wavelength of 193 nm as well as a beam-shaping optical arrangement producing a parallel light beam. The illumination system 10 includes in a known manner an optical unit 11 having a zoom objective configured to produce a parallel light beam of variable diameter, and an axicon lens. Depending on the respective zoom setting and the position of the axicon lens elements, different illumination configurations are produced by the zoom objective in conjunction with an upstream-disposed diffractive optical element (not shown in FIG. 8), in a pupil plane.

In the illustrated example, the optical unit 11 further includes a deflection mirror 12. The deflection mirror 12 is of a partially translucent nature via a suitable dielectric coating. Light which is coupled out by or which is allowed to pass through the deflection mirror 12 impinges on a dose or intensity sensor 13 for measuring the intensity distribution of that light. Disposed downstream of the optical unit 11 in the light propagation direction, in the beam path, is a light mixing device (not shown) which for example in per se known manner can have an arrangement of microoptical elements which is appropriate to achieve a light mixing effect, as well as a lens group 14. After lens group 14 there is a field plane with a reticle masking system (REMA), the image of which is projected by an REMA objective 15 which is at a downstream position in the light propagation direction onto the structure-bearing mask (reticle) 30 arranged in a further field plane, thereby limiting the illuminated region on the reticle. The structure-bearing mask 30 is imaged with a projection objective 20 onto a wafer or a substrate 40 provided with a light-sensitive layer.

Dose or intensity sensor 13 is used to measure the intensity distribution of the light which is coupled. That measurement operation, as such, does not provide any information about the polarization distribution and in particular it does not provide any information about the levels of intensity of the polarization components in mutually orthogonal directions (for example the x- and y-directions in the illustrated coordinate system).

Among others, US 2007/0146676 A1 discloses coupling the light by a beam splitter arranged in the light path of the illumination system, and analyzing the polarization state of the light.

SUMMARY

The disclosure provides an optical system and a method of characterising an optical system which permit characterisation the polarization state of the light passing through the optical system.

In some embodiments, an optical system having an optical axis includes:
  a first element which is partially translucent for light of a working wavelength of the optical system and has at least one partially reflecting first surface arranged rotated about a first axis of rotation in relation to a plane perpendicular to the optical axis,
  a second element in succession to the first element along the optical axis which is partially translucent for light of the working wavelength and has at least one partially reflecting second surface which is arranged rotated about a second axis of rotation in relation to a plane perpendicular to the optical axis, and
  an intensity measuring device for measuring the intensity of light reflected at the first surface and the intensity of light reflected at the second surface.

The wording that the second element is arranged in succession to the first element is used, in accordance with a preferred configuration, to denote that these elements are arranged in mutually adjacent relationship along the optical axis or in direct succession without further (partially translucent) optical elements being arranged in the beam path between those elements.

In certain embodiments, the disclosure provides an optical system having an optical axis and including:
  a first element which is partially translucent for light of a working wavelength of the optical system and has at least one partially reflecting first surface arranged rotated about a first axis of rotation in relation to a plane perpendicular to the optical axis,
  a second element which is partially translucent for light of the working wavelength and has at least one partially reflecting second surface which is arranged rotated about a second axis of rotation in relation to a plane perpendicular to the optical axis, and
  an intensity measuring device for measuring the intensity of light reflected at the first surface and the intensity of light reflected at the second surface.

The disclosure permits polarization-resolved intensity measurement without the measurement involving an unwanted change in the polarization distribution of the light remaining in the optical system (that is to say the light which is not coupled out of the optical system). In particular using the polarization-dependent reflection properties of the partially reflecting faces, that is to say the different reflectivities for mutually perpendicular polarization states (s- and p-polarization), it can be provided that information about the polarization state of the light remaining in the optical system can already be directly derived from the ascertained intensity distributions of the light which is coupled out, more specifically if the light measuring device is of a suitable configuration in positionally resolved relationship over the light beam cross-section.

In that respect the disclosure also makes use of the fact that in general it is not the complete information about the polarization distribution (that is to say knowledge of the complete Stokes vectors) that is required, but generally the IPS values of mutually perpendicular polarization states (s- and p-polarization) are of interest. The degree of implementation of a desired polarization state at a given location is referred to as the 'IPS value' (abbreviation for 'Intensity in Preferred State'), that is to say the IPS value specifies the relationship in terms of energy of the light intensity in a reference direction to the total intensity.

A further substantial advantage of the arrangement according to the disclosure is that polarization can be measured during ongoing operation of the optical system such as for example an illumination system of a microlithographic projection exposure apparatus (that is to say 'online') and in particular—if there is sufficient reaction speed in respect of the intensity measuring device—even in pulse-resolved fashion. Consequently permanent monitoring of the polarization state and if desired permanent re-adjustment thereof can be effected by the intensity and/or the polarization properties of the light passing through the optical system being specifically and targetedly varied in dependence on the measured or derived levels of intensity or polarization properties.

This concept can be embodied in particular both in the illumination system and also in the projection objective of a microlithographic projection exposure apparatus.

In accordance with some embodiments, the intensity measuring device has a first intensity sensor associated with the first element and a second intensity sensor associated with the second element.

In accordance with certain embodiments, the intensity measuring device, that is to say in the case of the above-described configuration the first and the second intensity sensors, has a plurality of channels for positionally resolved intensity measurement over the cross-section of a light beam.

In accordance with some embodiments, light issuing from the second element (that is to say transmitted light which is allowed through that element) is of a mean intensity which is at least 80% (e.g., at least 85%, at least 90%) of the mean intensity of light entering the first element. Consequently the arrangement of the first element and the second element can remain on the spot in operation of the optical system (in particular of a projection exposure apparatus) as only a comparatively small proportion of light is coupled out for intensity measurement. In that respect the expression mean intensity is used to denote the intensity averaged over the total beam cross-section at the respective position of the projection exposure apparatus.

In accordance with certain embodiments, light issuing from the second element (that is to say transmitted light let through that element) involves the same polarization state as light passing into the first element. Consequently the polarization state (which is not altered by the measurement operation) of the light remaining in the optical system can already be inferred from the intensity distributions, ascertained in accordance with the disclosure, of the coupled-out light, and the polarization state derived therefrom.

The disclosure also provides a microlithographic projection exposure apparatus including an illumination system and a projection objective. The illumination system and/or the projection objective have an optical system as set forth above.

In accordance with some embodiments, the first element and second element are configured so that they can be built in and/or removed from the exposure apparatus. In particular, these elements can form a measurement unit together with the associated sensors, wherein the whole measurement unit may be configured to be built in and/or removed from the exposure apparatus. In accordance with certain embodiments, the first element and second element or the measurement unit are configured so that they/it can be swivelled in and/or swivelled out of the region of a light beam during operation of the exposure apparatus. These embodiments are in particular advantageous in so far as a limitation of the transmission or a negative impact on the transmission can at least substantially be avoided.

The disclosure further provides optical system having an optical axis including:
  a first element which is partially translucent for light of a working wavelength of the optical system and has at least one partially reflecting first surface arranged rotated about a first axis of rotation in relation to a plane perpendicular to the optical axis;
  a second element which is partially translucent for light of the working wavelength and has at least one partially reflecting second surface which is arranged rotated about a second axis of rotation not parallel to the first axis of rotation in relation to a plane perpendicular to the optical axis; and
  an intensity measuring device for measuring the intensity of light reflected at the first surface and the intensity of light reflected at the second surface.

In addition, the disclosure provides an optical system having an optical axis and including:
  a first element which is partially translucent for light of a working wavelength of the optical system and has a partially reflecting first surface arranged rotated about a first axis of rotation in relation to a plane perpendicular to the optical axis, and a first intensity sensor associated with the first element; and
  a second element which is partially translucent for light of the working wavelength and has a partially reflecting second surface which is arranged rotated about a second axis of rotation in relation to a plane perpendicular to the optical axis, and a second intensity sensor associated with the second element;
  wherein light transmitted through the second element on issuing from the second element has the same intensity distribution and the same polarization distribution that the light has when entering the first element.

Moreover, the disclosure provides a method of characterising an optical system. The method includes: coupling out light at at least two partially reflecting surfaces which are arranged in succession along an optical axis of the optical system and which are respectively arranged rotated in relation to a plane perpendicular to the optical axis; and measuring the intensities of light respectively reflected at the partially reflecting surfaces.

In accordance with some embodiments, the method further includes: ascertaining on the basis of the measured intensities a value characteristic of the polarization state of the coupled-out light.

In accordance with certain embodiments, measuring the intensity and/or ascertaining a value characteristic of the polarization state of the coupled-out light is effected repetitively during operation of the optical system.

In accordance with some embodiments, measuring the intensity and/or ascertaining a value characteristic of the polarization state of the coupled-out light is effected in positionally resolved relationship over the cross-section of a light beam.

In accordance with certain embodiments, this is carried out in a microlithographic projection exposure apparatus.

In accordance with some embodiments, measuring the intensity and/or ascertaining a value characteristic of the polarization state of the coupled-out light is effected in pulse-resolved relationship in a pulse mode of operation of the optical system.

In accordance with certain embodiments, the method further includes varying the intensity and/or the polarization properties of light passing through the optical system in dependence on the measured intensities and/or the value characteristic of the polarization state of the coupled-out light.

The disclosure also provides a microlithographic projection exposure apparatus including an illumination system for illuminating a mask, and a projection objective for projecting a structure present on a mask on to a light-sensitive layer. The projection exposure apparatus is designed so that a polarization-dependent intensity measurement operation can be carried out during the projection operation.

In accordance with some embodiments, a proportion of light which is coupled out for the polarization-dependent intensity measurement operation is less than 20%, such as less than 10%, of the mean intensity of the light passing into the illumination system.

In accordance with certain embodiments, the polarization-dependent intensity measurement operation can be carried out without disturbing the polarization state.

The disclosure further provides a process for the microlithographic production of microstructured components. The process includes: providing a substrate to which a layer of a light-sensitive material is at least partially applied; providing a mask which has structures, the images of which are to be produced; providing a microlithographic projection exposure apparatus; and projecting at least a part of the mask on to a region of the layer via the projection exposure apparatus. Measurement of the polarization-dependent intensity is effected during the projection operation.

BRIEF DESCRIPTION OF THE DRAWINGS

Further configurations of the disclosure are set forth in the description, claims and figures. The disclosure is described in greater detail hereinafter by exemplary embodiments and the accompanying drawings, in which:

DETAILED DESCRIPTION OF THE PREFERRED EMBODIMENTS

Figure 1:
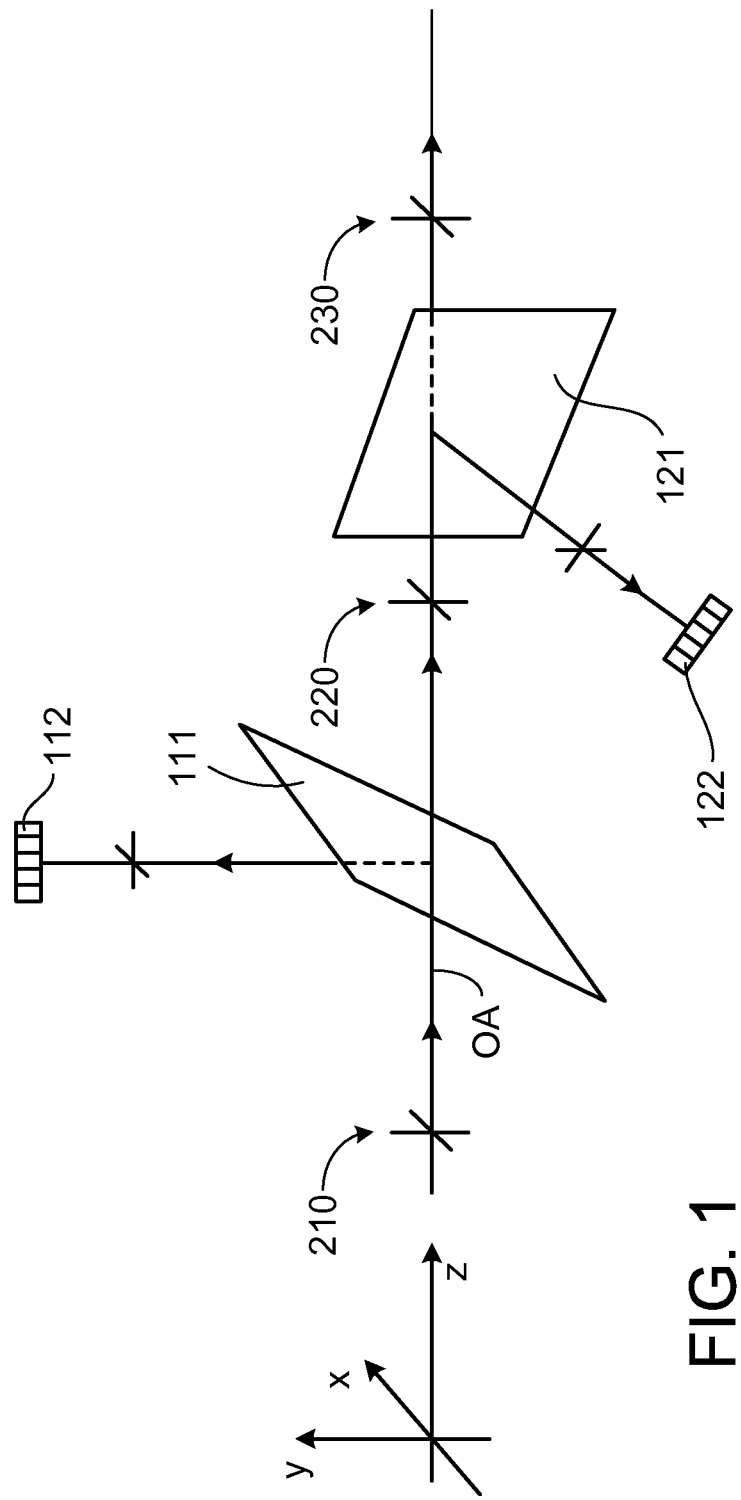
FIG. 1 shows a diagrammatic view to explain an arrangement used in an optical system or a method according to the disclosure.

Reference is made to FIG. 1 to describe the basic structure of an arrangement used in a method or optical system according to the disclosure. The optical system or the arrangement has in succession along an optical axis OA of the optical system, a first element 111 which is partially translucent for light of the working wavelength and a second element 121 which is partially translucent and which is arranged subsequently along the optical axis OA. The arrangement can be provided in particular in accordance with a preferred application of the present disclosure in a microlithographic projection exposure apparatus, in particular in an illumination system of that projection exposure apparatus, as is described in greater detail hereinafter with reference to FIGS. 4 and 5.

The partially translucent elements 111 and 121 which are only diagrammatically shown in FIG. 1 are produced in the illustrated embodiment from quartz glass ($SiO_2$) and are each in the form of plane plates, in which respect typical plate thicknesses can be for example in the region of less than 1 millimeter, for example being 0.5 mm. Associated with each of the partially translucent elements 111 and 121 in FIG. 1 is a respective intensity sensor 112 and 122 having a plurality of channels for positionally resolved measurement of the intensity over the light beam cross-section.

Each of the elements 111 and 121 has at least one partially reflecting surface, the light reflected at the respective partially reflecting surface impinging on the associated sensor 112 and 122 respectively. In that respect the partially translucent elements 111 and 121 in the illustrated embodiment are such that, of their optically effective surfaces, only one respective surface, namely in the illustrated example the respective light entrance surface, is partially reflecting, to avoid multiple reflections and disturbances caused thereby. The light exit surface of the first partially translucent element 111 in the illustrated embodiment, like the light exit surface of the second partially translucent element 121, is coated with an AR layer.

The light entrance surface of the first partially translucent element 111 and the light entrance surface of the second partially translucent element 121 can each be uncoated so that the partial reflection of the impinging light occurs in each case in accordance with the Fresnel formulae. In that respect as the order of magnitude for example the degree of reflection for the s-component can be about 10% whereas the degree of reflection for the p-component decreases in dependence on the angle of incidence from about 5% to zero (if the angle of incidence is the same as the Brewster angle).

In some embodiments, as a modification of the above-described configuration, the respective light entrance surfaces of the partially translucent elements 111 and 121 can also be dielectrically coated to attenuate the polarization-dependent reflection occurring at those surfaces and thus to reduce or minimise the light loss and thus optimise transmission of the structure.

The partially translucent elements 111 and 121 are turned or tilted in the illustrated embodiment through two mutually orthogonal axes of rotation. In that respect the positions of the partially translucent elements 111 and 121 can be respectively described by tilting with respect to a starting plane parallel to the x-y-plane. In that case the partially translucent element 111 is tilted about the x-axis through an angle of 45° with respect to a starting plane parallel to the x-y-plane. The partially translucent element 121 is tilted about the y-axis through an angle of 45° relative to a starting plane parallel to the x-y-plane.

Figure 2:
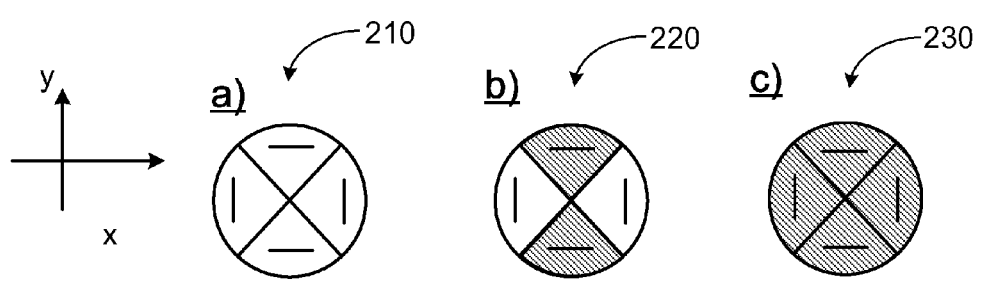
FIGS. 2a-c show diagrammatic views of the polarization distributions obtained in operation of the optical system at different positions of the arrangement of FIG. 1.
Figure 3:
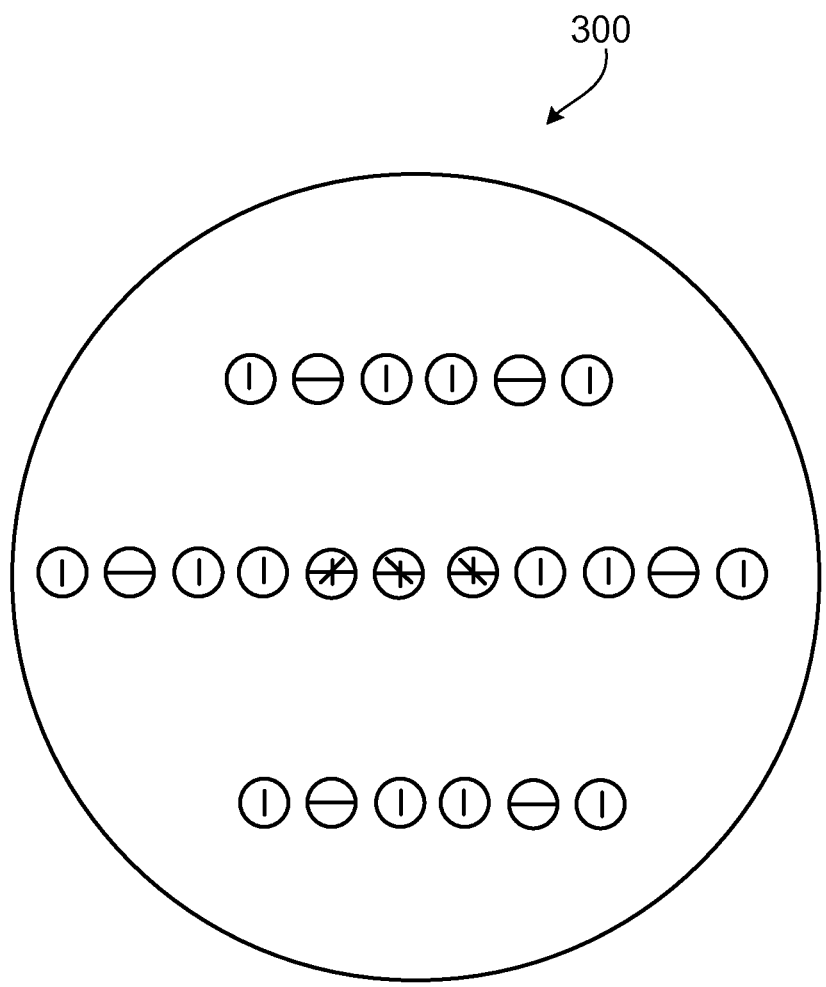
FIG. 3 shows an exemplary polarization distribution in a pupil plane of an optical system for explaining an application of the method according to the disclosure.

FIG. 2 shows a diagrammatic view of the intensity or polarization distributions obtained at different positions marked in the beam path of the arrangement in FIG. 1.

The example as shown in FIG. 2a is based on an entrance polarization distribution 210 of the light impinging on the first partially translucent element 111 in the form of what is referred to as x-y-polarization (also referred to as quasi-tangential polarization distribution), in which regions in the form of segments of a circle and disposed in opposite relationship in the x- and y-directions respectively have a polarization direction in the x- and y-direction respectively. That polarization distribution is identified by reference 210 in FIG. 2a. The four segment-shaped regions each involve the same respective intensity.

The partially translucent elements 111 and 121 each have a higher degree of reflection for the s-polarized component, that is to say the component polarized perpendicularly to the plane of incidence, wherein that plane of incidence is defined in the usual fashion by the normal vector of the light entrance surface and the direction of incidence.

Between the two partially translucent elements 111 and 121 respectively that affords the intensity distribution 220 shown in FIG. 2b, which results from the fact that the light components polarized in the y-direction, as a result of the reflection at the light entrance surface of the first element 111, are attenuated less greatly than the light components polarized in the x-direction. The regions with polarization oriented in the x-direction (that is to say horizontally) are therefore of lower intensity than the regions with polarization oriented in the y-direction (that is to say vertically), which is illustrated in FIG. 2b by the hatching of those intensity-attenuated regions.

In subsequent reflection at the light entrance surface of the second partially translucent element 121, as a result of the selected axes and angles of rotation of the elements 111 and 121, the previously less strongly reflected light components are reflected more greatly to the same degree, and vice-versa. The polarization distribution 230 thus presents a distribution which is admittedly attenuated in respect of the absolute intensity values in relation to the original intensity distribution 210 but which is again homogeneous, that is to say the four segment-shaped regions each involve the same respectively intensity.

As a result the arrangement of FIG. 1 thus provides that, in spite of the light coupling-out effect which is implemented by the partially translucent elements 111 and 121 at two successive positions along the optical axis OA, the light which is let through the second partially translucent element 121 and which thus remains in the optical system is unchanged in comparison with the light entering the first partially translucent element 111, both in respect of the intensity distribution and also the polarization distribution.

It will be apparent from the foregoing description that the sensor 112 in conjunction with the partially translucent element 111 measures a greater proportion of x-polarization whereas the sensor 122 in conjunction with the partially translucent element 121 measures a proportion, which is greater by the same degree, of y-polarization. Both polarization components are thus overall coupled out in equal strength so that the total intensity is not influenced in respect of its relative configuration over the pupil.

As a result therefore the relative intensity distribution over the pupil to be measured remains uninfluenced except for an offset to be attributed to the light coupling-out effect, so that in particular no ellipticicity components or telecentric errors are introduced into the optical system. Ellipticicity and telecentry are illumination-specific parameters which describe the relative light distribution within the pupil and remain unchanged by the arrangement according to the disclosure.

The above-described property of the arrangement according to the disclosure applies precisely for beams parallel to the optical axis OA, but in a good approximation also for beams which extend at a slight angle (a few degrees) relative to the optical axis OA (that is to say relatively small apertures or divergence angles). For larger beam angles relative to the optical axis OA, if desired it is possible to effect adaptation by suitable dielectric layers on the partially reflecting surfaces. Advantageous positions are therefore in particular those positions in the illumination system, at which the beam angles are comparatively small (for example within the optical unit having the zoom-axicon lens module). Optionally, when angle distribution is present, it is also possible to use an optical imaging system in order to produce the image of the light distribution arising after reflection at the first element 111, on the sensor 112, and in that case to avoid falsification of the association between the locations in light distribution and the channels on the sensor 112 as a consequence of beam divergence.

The disclosure is not limited to the specific tilting of the elements 111 and 121 or the partially reflecting surfaces thereof, as is shown in FIG. 1. Rather, it is also possible to select different tilt angles, in which case account is to be taken of the fact that the reflectivities $R_p$ and $R_s$ are respectively functions of the tilt angle. Furthermore, any offsets present elsewhere in the system can also be managed by specific targeted changes in the tilt angles relative to the position shown in FIG. 1.

The procedure in principle when implementing the position-resolved intensity or dose measuring operation which the present disclosure makes possible is described hereinafter. In that respect hereinafter $I_1$ denotes the intensity at the location of the sensor 112 and $I_2$ denotes the intensity at the location of the sensor 122. The following applies at the sensor 112:

$$I_1 = R_{p,1} * I_p + R_{s,1} * I_s \quad (1)$$

$I_p$ denotes the intensity of the p-polarized light component and $I_s$ the intensity of the s-polarized light component of the light impinging on the sensor 112, wherein the associated reflectivities are denoted by $R_{p,1}$ and $R_{s,1}$ respectively for the partially reflecting surface of the partially translucent first element 111 and $R_{p,2}$ and $R_{s,2}$ respectively denote the associated reflectivities for the partially reflecting surface of the partially translucent second element 121.

The following applies at the sensor 122:

$$I_2 = (1 - R_{p,1}) * R_{s,2} * I_p + (1 - R_{s,1}) * R_{p,2} * I_s \quad (2)$$

In that respect, equation (2) takes account of the fact that, as a consequence of the selected tilting of the partially translucent second element 121 in comparison with the partially translucent first element 111, the original p-component (that is to say related to the first element 111 M1), in relation to the second element 121, now represents the s-component, and vice-versa. For the simple special case where the reflectivities $R_{p,1}$ and $R_{s,1}$ of the partially reflecting surface of the first element 111 are respectively the same as the corresponding reflectivities $R_{p,2}$ and $R_{s,2}$ of the partially reflecting surface of the second element 121, equation (2) is simplified, with $R_{p,1}=R_{p,2}=R_p$ and $R_{s,1}=R_{s,2}=R_s$, is simplified to give the following:

$$I_2=(1-R_p)*R_s*I_p+(1-R_s)*R_p*I_s \quad (3)$$

Accordingly the values $I_p$ and $I_s$ can be ascertained as follows from a measurement of the values $I_1$ and $I_2$ and from knowledge (or one-off measurement or calibration) of the reflectivities $R_{p,1}$, $R_{s,1}$, $R_{p,2}$ and $R_{s,2}$ (or $R_s$ and $R_p$ respectively):

$$I_p=(-R_p*I_1+R_p*I_1*R_s+R_s*I_2)/N \quad (4)$$

$$I_s=(-R_s*I_1+R_p*I_1*R_s+R_p*I_2)/N \quad (5)$$

wherein in each case $N=-R_p^2+R_p^2*R_s+R_s^2-R_s^2*R_p$.

Once again it is possible to calculate therefrom the respective IPS values $IPS_s$ (for s-polarization) and $IPS_p$ (for p-polarization). The following apply:

$$IPS_s=I_s/(I_p+I_s) \quad (6)$$

and $$IPS_p=I_p/(I_p+I_s) \quad (7).$$

As, when the sensors 112 and 122 are formed with a respective plurality of channels distributed over the light beam cross-section, the measurement operation gives a pair of values ($I_1$, $I_2$) for each of those channels, the IPS distribution can thus be ascertained in positionally resolved relationship over the pupil.

Figure 7:
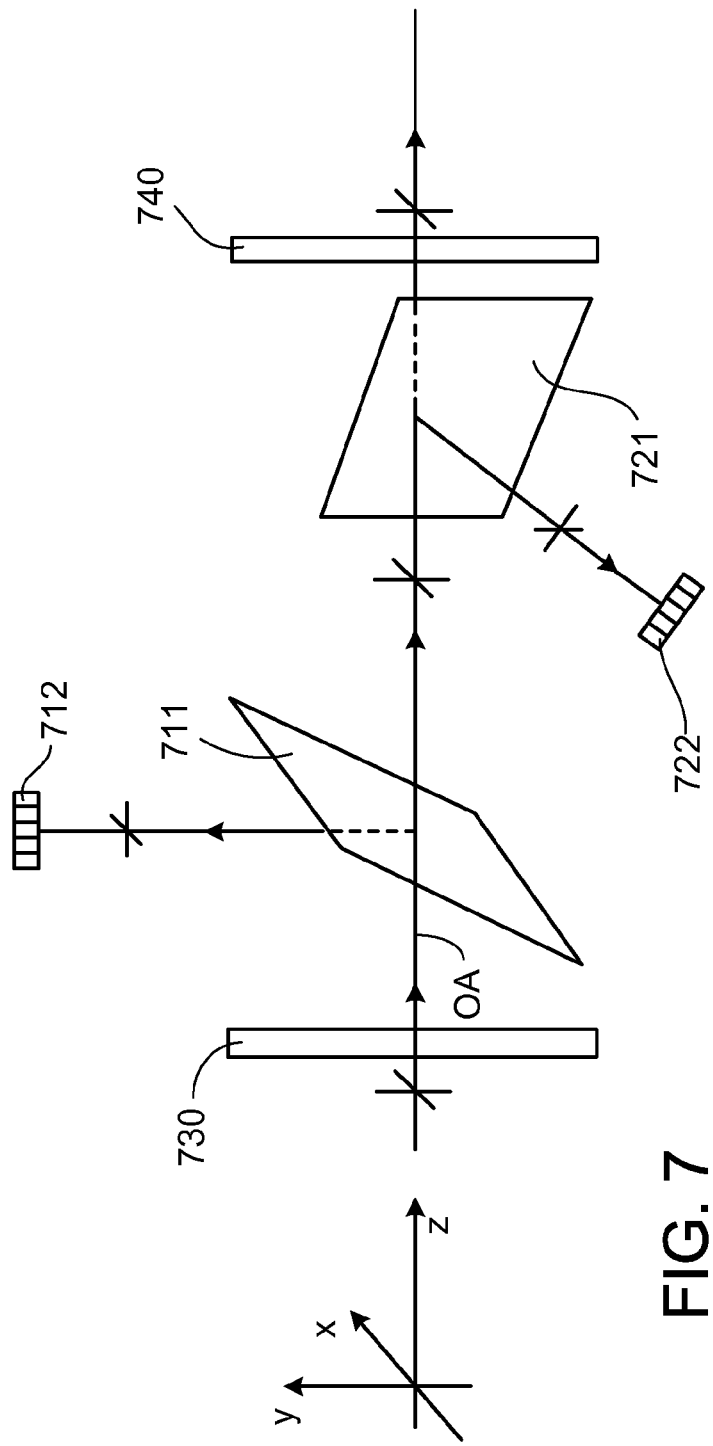
FIG. 7 shows a diagrammatic view to describe an arrangement according to a further embodiment, which is used in an optical system or a method according to the disclosure.
Figure 8:
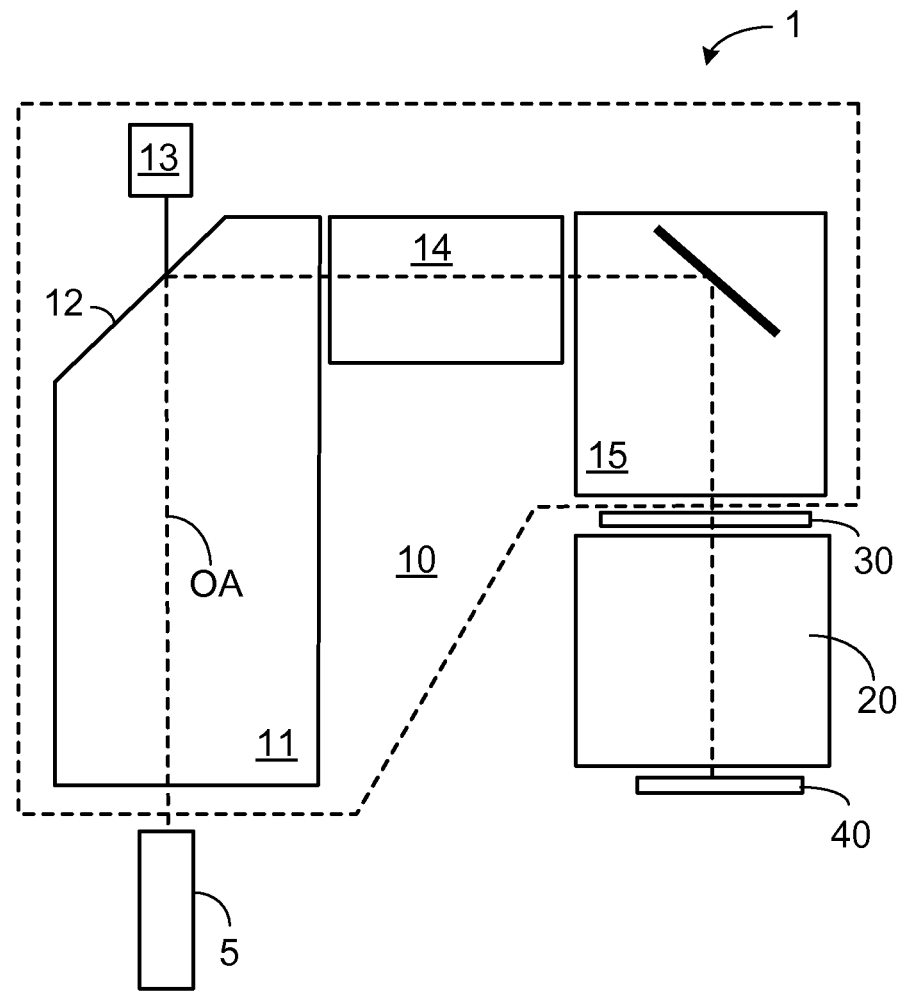
FIG. 8 shows a diagrammatic view of a microlithographic projection exposure apparatus according to the state of the art.

FIG. 7 shows a further embodiment of the disclosure, wherein elements corresponding to FIG. 1 or involving the same function are denoted by corresponding references increased by 600. Unlike FIG. 1, the arrangement in FIG. 7 provides that a respective lambda/2-plate 730 and 740 (for example of $MgF_2$) is arranged in the light propagation direction upstream of the first partially translucent element 711 and in the light propagation direction downstream of the second partially translucent element 721 respectively. In that respect the second lambda/2-plate 740 rotates the polarization direction through an angle of the same magnitude and of opposite sign as the first lambda/2-plate 730. That configuration permits measurement of the IPS distribution for polarization directions in any direction (that is to say without restriction to the x-direction or y-direction respectively in accordance with the illustrated coordinate system).

Figure 4:
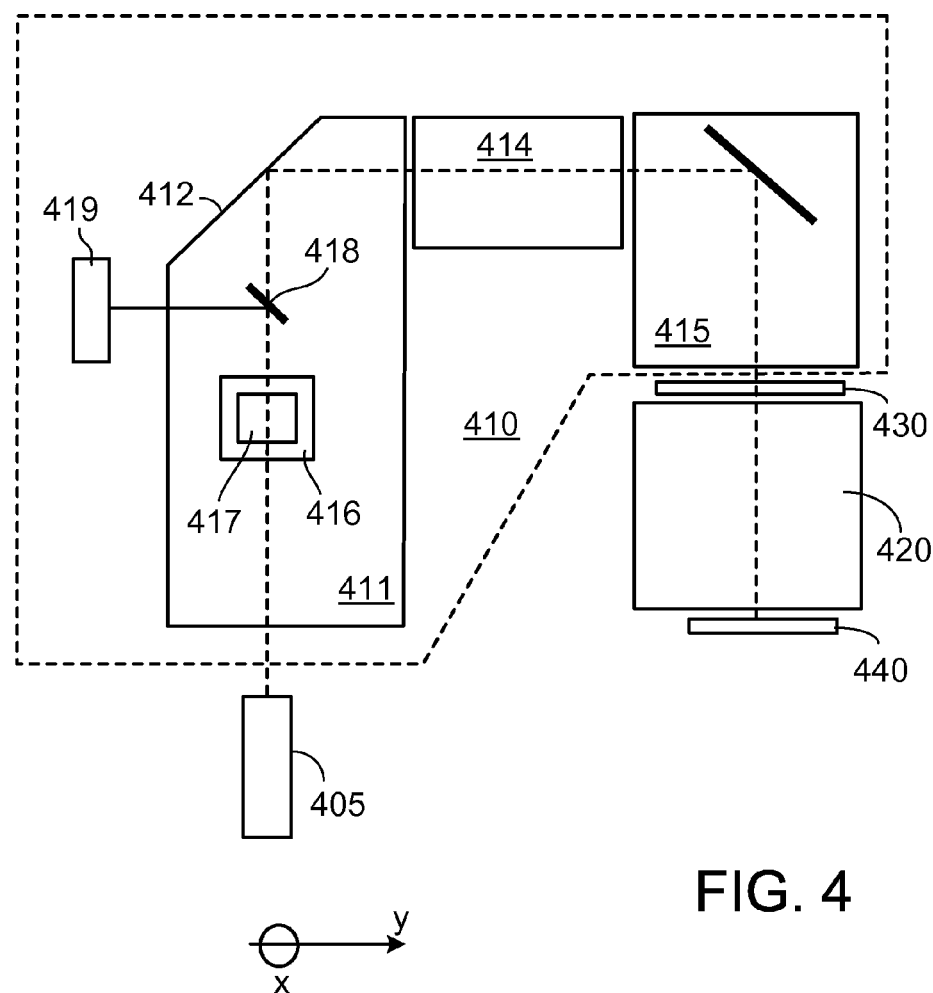
FIGS. 4-5 show diagrammatic views of microlithographic projection exposure apparatuses for describing preferred embodiments of the present disclosure.
Figure 5:
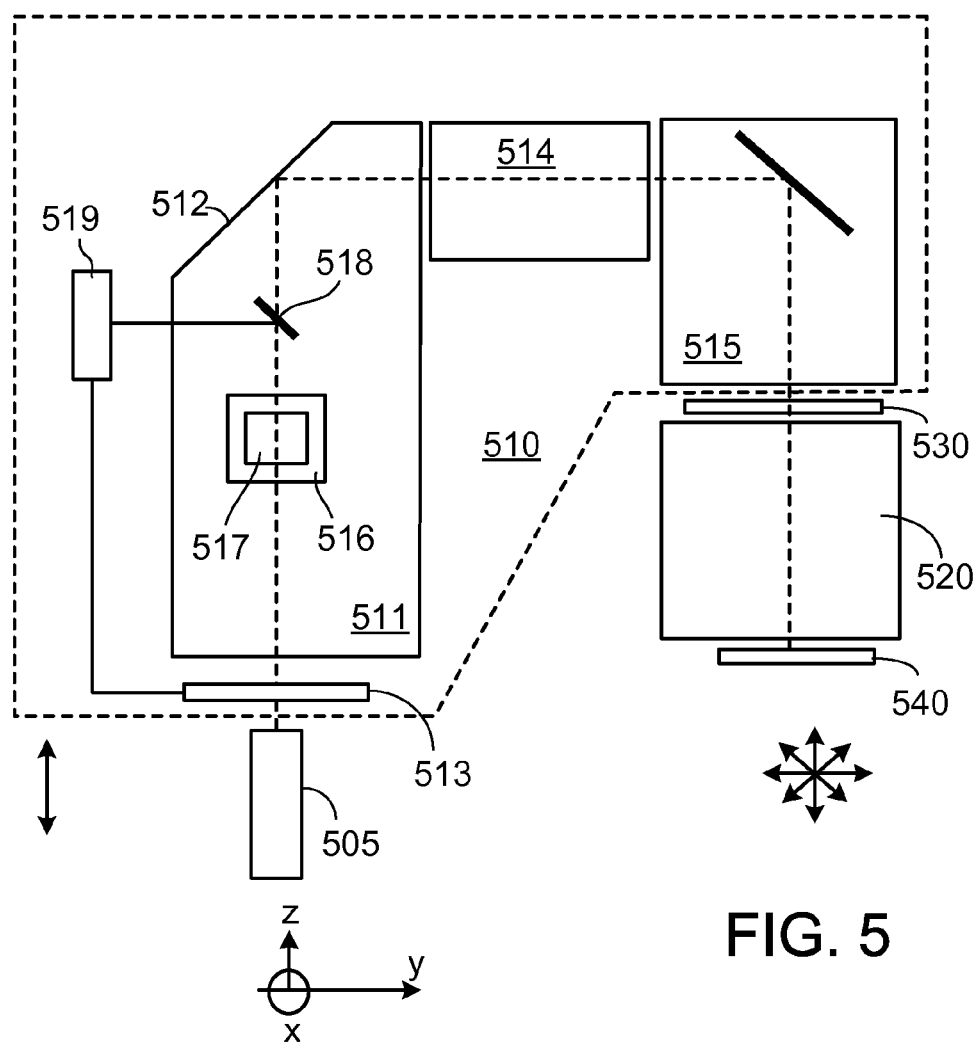

Reference is now made to FIGS. 4 and 5 to describe hereinafter embodiments of the above-described arrangement in an illumination system.

Referring to FIG. 4 the illumination system 410 serves for the illumination of a structure-bearing mask (reticle) 430 with light from a light source unit 405 which for example includes an ArF laser for a working wavelength of 193 nm and an optical beam-shaping arrangement for producing a parallel light beam. The illumination system 410 has in known manner an optical unit 411 which has a zoom objective for producing a parallel light beam of variable diameter and an axicon lens as well as a deflection mirror 412. Different illumination configurations are produced in a pupil plane, depending on the respective zoom position and the position of the axicon lens elements, via the zoom objective in conjunction with a diffractive optical element (not shown in FIG. 4) disposed at an upstream position. Downstream of the optical unit 411 in the light propagation direction, in the beam path, there is a light mixing device (not shown) which for example in per se known manner can have an arrangement of microoptical elements suitable for producing a light mixing effect, as well as a lens group 414, behind which there is a field plane with a reticle masking system (REMA), the image of which is produced on the structure-bearing mask (reticle) 430 arranged in a further field plane by an REMA objective 415 which follows in the light propagation direction, and thereby limits the illuminated region on the reticle. The structure-bearing mask 430 is projected with a projection objective 420 on to a substrate 440 provided with a light-sensitive layer, or a wafer.

Disposed within the optical unit 411 in the arrangement already described with reference to FIG. 1 is a first partially translucent element 416 with associated first sensor 417 and a second partially translucent element 418 with associated second sensor 419, wherein, as described hereinbefore, polarization-resolved dose or intensity measurement can be effected via this arrangement, in a manner which is positionally resolved over the light beam cross-section, as well as in pulse-resolved relationship during ongoing operation of the projection exposure apparatus.

Implementation of the polarization-resolved dose or intensity measurement operation can alternatively or additionally also be effected outside the optical unit 411, for example within the REMA objective 415 and/or within the projection objective 420.

According to a further embodiment (not shown in FIG. 4), the arrangement of the first partially translucent element with associated first sensor and the second partially translucent element with associated second sensor can be, in a selective and flexible manner, built in and/or removed from the exposure apparatus. In particular, the arrangement may be configured in such a way that it can be swivelled in and/or swivelled out of the region of a light beam during operation of the exposure apparatus, using appropriate actuators, drive mechanisms or the like for manipulating the position of the elements and if given/optionally also the position of the sensors. Such an implementation of the disclosure has the further advantage that the transmission of the system is not or only marginally affected.

FIG. 5 shows a further embodiment of a projection exposure apparatus according to the disclosure, wherein elements corresponding to FIG. 4 or involving the same function are denoted by corresponding references increased by 100. As shown in FIG. 5 there is additionally provided a retardation element 513 which for example can be in the form of a lambda/2-plate and which can be dynamically differently set during the scanning procedure so that different polarization states occur on the wafer plane, as indicated in FIG. 5 by the multiplicity of double-headed arrows in the region of the wafer plane.

The retardation element 513 serves to provide that the projection exposure apparatus can be so designed that the desired polarization occurs only as a consequence of averaging over the scanning process, without however being already in conformity at any individual field point with the desired polarization prior to that averaging step. In that respect during the scanning process polarization can be altered for example by successive rotation of the preferred polarization direction in such a way that effectively all polarization states occur to the same degree at any location on the wafer so that those polarization states are incoherently superposed to afford unpolarized light. In that way a lithography process can be carried out with effectively unpolarized light without the need to use a depolarizer for that purpose. By way of example when exposing a position on the wafer with a total number of 40 pulses it is also possible to set 40 different rotational positions of the preferred polarization direction. In that respect if desired constant re-setting of the respectively set polarization direction can be effected, as a consequence of the polarization-resolved dose measuring operation which in accordance with the disclosure is made possible 'online', that is to say in operation or during the exposure process, as is described hereinafter with reference to FIG. 6.

Figure 6:
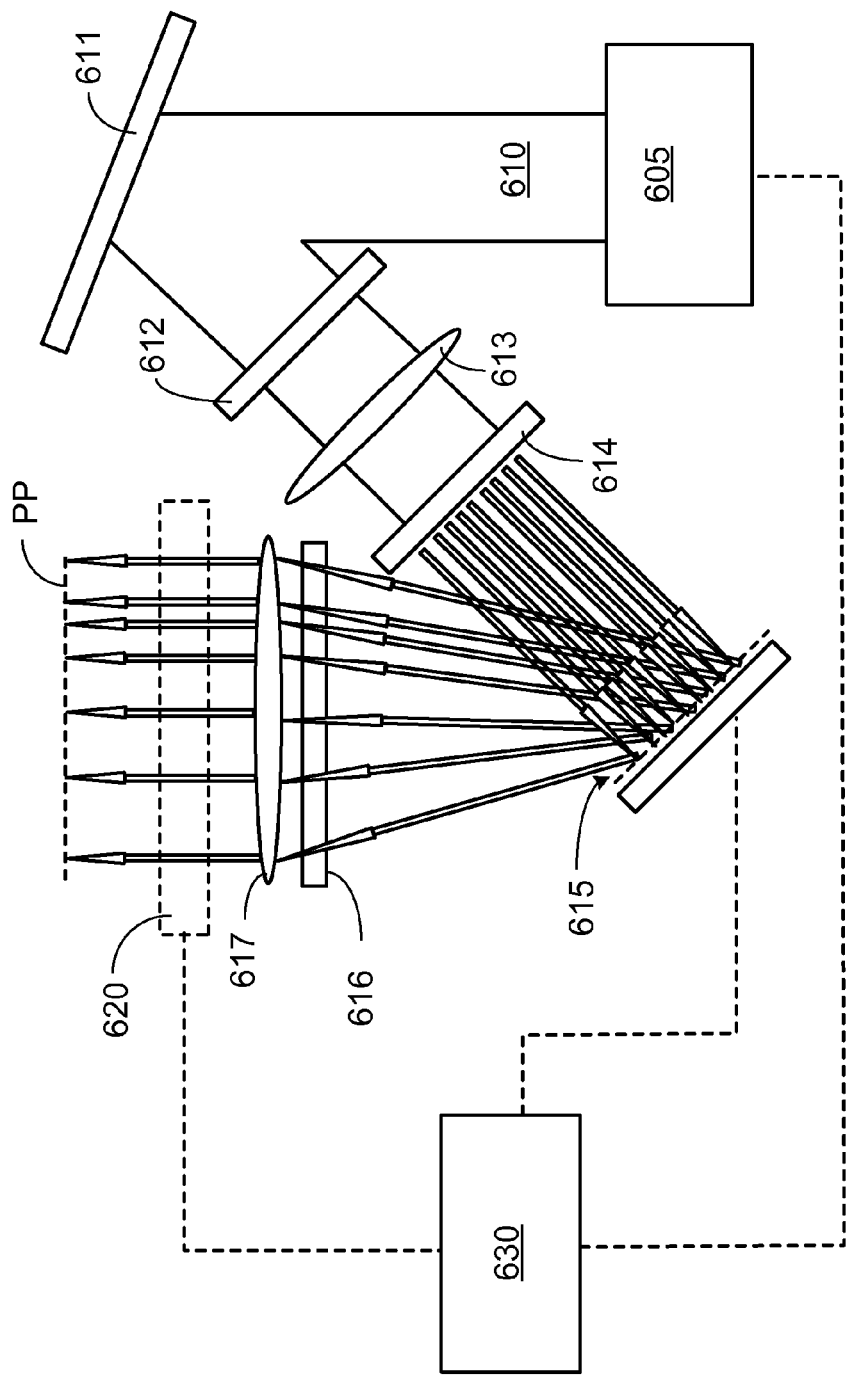
FIG. 6 shows a diagrammatic view to describe a manipulation, which is effected in accordance with an embodiment of the disclosure, of polarization distribution in an illumination system.

Referring to FIG. 6 the intensity or polarization distribution ascertained in the structure of for example FIG. 1, 4 or 5 can be used to implement a specific targeted change in the intensity distribution during an exposure process and in positionally resolved relationship.

FIG. 6 shows a portion of an illumination system which in the beam path of a laser beam 60 produced by a laser light source 605 successively includes a deflection mirror 611, a refractive optical element (ROE) 612, a lens 613 (only shown by way of example), a microlens arrangement 614, a micromirror arrangement 615, a diffuser 616, a lens 617 and a pupil plane PP. The micromirror arrangement 615 includes a multiplicity of micromirrors and the microlens arrangement 614 has a multiplicity of microlenses for specific targeted focusing on those micromirrors.

The arrangement described hereinbefore with reference to FIG. 1, FIG. 4 and FIG. 5, including at least two partially translucent elements and associated intensity or dose sensors for partially coupling out light and measuring intensity distribution is only diagrammatically indicated in FIG. 6 and identified by reference 620. In FIG. 6, the output signals of those sensors of the arrangement 620 are fed to a control device 630, by which once again during the exposure process selective actuation of the micromirrors of the micromirror arrangement 615 is effected so that for example when an unwanted change in the intensity or polarization distribution is detected a suitable re-adjustment or correction can be effected by displacement of the micromirrors associated with the respective pupil locations.

In that respect, particularly involving a configuration of the sensors of the arrangement 620 with a two-dimensional array of channels, extending over the light beam cross-section, those channels can be read out in parallel and, in the event of a deviation in one of those channels from a reference value, the micromirror, associated with that channel or the corresponding pupil location, of the micromirror arrangement 615 can be re-adjusted.

Accordingly therefore active re-setting of the individual mirror elements or 'micromirrors' can be effected via the structure described with reference to FIG. 6.

Even if the disclosure has been described via specific embodiments numerous variations and alternative embodiments will be apparent to the man skilled in the art, for example by combination and/or exchange of features of individual embodiments. Accordingly it will be appreciated by the man skilled in the art that such variations and alternative embodiments are also embraced by the present disclosure and the scope of the disclosure is limited only in the sense of the accompanying patent claims and equivalents thereof.

The invention claimed is:

1. An optical system having an optical axis, the optical system comprising:
   a first element which is partially translucent for light of a working wavelength of the optical system, the first element having at least one partially reflecting first surface that is rotated at a first angle about a first axis of rotation relative to a plane perpendicular to the optical axis of the optical system;
   a second element in succession to the first element along the optical axis of the optical system so that there is no optical element between the first and second elements along the optical axis of the optical system, the second element being partially translucent for light of the working wavelength, the second element having at least one partially reflecting second surface that is rotated at a second angle about a second axis of rotation relative to the plane perpendicular to the optical axis of the optical system; and
   an intensity measuring device configured to measure an intensity of light reflected at the first surface and an intensity of light reflected at the second surface,
   wherein:
      the second axis of rotation is not parallel to the first axis of rotation;
      the optical system is a microlithography illumination system or a microlithography projection objective; and
      during use of the optical system:
         the first element splits light entering the first element into no more than two light beams;
         light that is transmitted through the first element enters the second element; and
         the second element splits light entering the second element into no more than two light beams.

2. An optical system as set forth in claim 1, wherein the first and second axes of rotation are arranged relative to each other at an angle of 90°±5°.

3. An optical system as set forth in claim 1, wherein the first and second angles are identical in magnitude to within 10%.

4. An optical system as set forth in claim 1, wherein the first angle is 45°±10°, and the second angle is 45°±10°.

5. An optical system as set forth in claim 1, wherein the intensity measuring device comprises:
   a first intensity sensor configured to measure the intensity of light reflected at the first surface; and
   a second intensity sensor configured to measure the intensity of light reflected at the second surface.

6. An optical system as set forth in claim 1, wherein the intensity measuring device comprises a plurality of channels configured to positionally resolve intensity measurement over a cross-section of a light beam.

7. An optical system as set forth in claim 1, wherein the first element and/or the second element has a light exit surface comprising an anti-reflecting coating.

8. An optical system as set forth in claim 1, wherein the first element and/or the second element has a light entrance surface comprising a partially translucent dielectric coating.

9. An optical system as set forth in claim 1, wherein the first element and/or the second element comprises quartz glass ($SiO_2$).

10. An optical system as set forth in claim 1, wherein, during use, the light transmitted through the second element on issuing from the second element has a mean intensity which is at least 80% of a mean intensity of the light that enters the first element.

11. An optical system as set forth in claim 1, wherein, during use, the light transmitted through the second element on issuing from the second element has the same polarization state that the light has when entering the first element.

12. An optical system as set forth in claim 1, wherein the optical system is configured to be used in a microlithographic projection exposure apparatus.

13. An optical system as set forth in claim 1, further comprising a device configured to vary intensity and/or polarization properties of light passing through the optical system in dependence on output signals of the intensity measuring device.

14. An apparatus, comprising:
the optical system as set forth in claim 1,
wherein the apparatus is a microlithographic projection exposure apparatus.

15. An apparatus as set forth in claim 14, wherein the first and second elements are configured so that they can be built in and/or removed from the exposure apparatus.

16. An apparatus as set forth in claim 14, wherein the first and second elements are configured so that they can be swivelled in and/or swivelled out of the region of a light beam during operation of the exposure apparatus.

17. An apparatus as set forth in claim 14, wherein the optical system is a microlithography illumination system.

18. An apparatus as set forth in claim 14, wherein the optical system is a microlithography projection objective.

19. An optical system as set forth in claim 1, wherein the first element is a first plane plate and the second element is a second plane plate.

20. An optical system as set forth in claim 1, wherein the optical system is a microlithography illumination system.

21. An optical system as set forth in claim 1, wherein the optical system is a microlithography projection objective.

22. An optical system having an optical axis, the optical system comprising:
a first element which is partially translucent for light of a working wavelength of the optical system, the first element having a partially reflecting first surface that is rotated at a first angle about a first axis of rotation relative to a plane perpendicular to the optical axis of the optical system;
a first intensity sensor configured to measure an intensity of light reflected at the first surface;
a second element which is partially translucent for light of the working wavelength, the second element having a partially reflecting second surface that is rotated at a second angle about a second axis of rotation relative to the plane perpendicular to the optical axis of the optical system, and the second element is arranged in succession to the first element so that there is no optical element between the first element and the second element along the optical axis of the optical system; and
a second intensity sensor configured to measure an intensity of light reflected at the second surface;
wherein:
the optical system is a microlithography illumination system or a microlithography projection objective; and
during use of the optical system:
the first element splits light entering the first element into no more than two light beams;
light that is transmitted through the first element enters the second element;
the second element splits light entering the second element into no more than two light beams;
light that is transmitted through the second element on issuing from the second element has a first intensity distribution and a first polarization distribution;
light entering the first element has a second intensity distribution and a second polarization distribution;
the first intensity distribution is the same as the second intensity distribution; and
the first polarization distribution is the same as the second polarization distribution.

23. An optical system as set forth in claim 22, wherein the first element is a first plane plate and the second element is a second plane plate.

24. An optical system as set forth in claim 22, wherein the first and second axes of rotation are arranged relative to each other at an angle of 90°±5°.

25. An optical system as set forth in claim 22, wherein the optical system is a microlithography illumination system.

26. An optical system as set forth in claim 22, wherein the optical system is a microlithography projection objective.

27. A method, comprising:
coupling out light at first element and second element that are arranged in succession so that there is no optical element between the first element and the second element along an optical axis of an optical system, the first element has a first partially reflecting surface which is rotated about a first axis of rotation relative to a plane perpendicular to the optical axis of the optical system, and the second element has a second partially reflecting surface which is rotated about a second axis of rotation relative to the plane perpendicular to the optical axis of the optical system; and
measuring the intensities of light respectively reflected at the two partially reflecting surfaces,
wherein:
the first axis is different from the second axis;
the optical system is a microlithography illumination system or a microlithography projection objective
the first element splits light entering the first element into no more than two light beams;
light that is transmitted through the first element enters the second element; and
the second element splits light entering the second element into no more than two light beams.

28. A method as set forth in claim 27, wherein the measured intensities are positionally resolved over a light beam cross-section.

29. A method as set forth in claim 27, wherein the intensity of light is measured in a pulse-resolved manner via a pulse mode of operation of the optical system.

30. A method as set forth in claim 27, further comprising ascertaining, on the basis of the measured intensities, a value characteristic of the polarization state of the coupled-out light.

31. A method as set forth in claim 30, wherein the value characteristic of the polarization state of the coupled-out light is repeatedly ascertained during operation of the optical system.

32. A method as set forth in claim 27, wherein the optical system is used in a microlithographic projection exposure apparatus, and the method comprises producing a microstructure component.

33. A method as set forth in claim 27, further comprising varying intensity and/or polarization properties of light passing through the optical system in dependence on the measured levels of intensity.

34. A method as set forth in claim 27, wherein the first element is a first plane plate and the second element is a second plane plate.

35. A method as set forth in claim 27, wherein the first and second axes of rotation are arranged relative to each other at an angle of 90°±5°.

36. A method as set forth in claim 27, wherein the optical system is a microlithography illumination system.

37. A method as set forth in claim 27, wherein the optical system is a microlithography projection objective.

* * * * *

UNITED STATES PATENT AND TRADEMARK OFFICE
CERTIFICATE OF CORRECTION

PATENT NO. : 8,625,071 B2  Page 1 of 1
APPLICATION NO. : 12/778649
DATED : January 7, 2014
INVENTOR(S) : Damian Fiolka It is certified that error appears in the above-identified patent and that said Letters Patent is hereby corrected as shown below:

In the Specification

Col. 8, line 11, delete "ellipticicity" and insert -- ellipticity --.

Col. 8, line 12, delete "Ellipticicity" and insert -- Ellipticity --.

Signed and Sealed this
Thirteenth Day of May, 2014

Michelle K. Lee
*Deputy Director of the United States Patent and Trademark Office*